United States Patent
Kellerman et al.

(10) Patent No.: US 6,947,274 B2
(45) Date of Patent: Sep. 20, 2005

(54) CLAMPING AND DE-CLAMPING SEMICONDUCTOR WAFERS ON AN ELECTROSTATIC CHUCK USING WAFER INERTIAL CONFINEMENT BY APPLYING A SINGLE-PHASE SQUARE WAVE AC CLAMPING VOLTAGE

(75) Inventors: Peter L. Kellerman, Essex, MA (US); Shu Qin, Malden, MA (US); William F. DiVergilio, Beverly, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 129 days.

(21) Appl. No.: 10/657,449

(22) Filed: Sep. 8, 2003

(65) Prior Publication Data

US 2005/0052817 A1 Mar. 10, 2005

(51) Int. Cl.[7] ............................................... H01F 13/02
(52) U.S. Cl. ....................................... 361/234; 361/235
(58) Field of Search .................................. 361/234, 235

(56) References Cited

U.S. PATENT DOCUMENTS

| | | | | |
|---|---|---|---|---|
| 5,103,367 A | * | 4/1992 | Horwitz et al. ............. 361/234 |
| 5,117,121 A | | 5/1992 | Watanabe et al. |
| 5,325,261 A | | 6/1994 | Horwitz |
| 5,444,597 A | | 8/1995 | Blake et al. |
| 5,452,177 A | | 9/1995 | Frutiger |
| 5,583,736 A | | 12/1996 | Anderson et al. |
| 5,754,391 A | * | 5/1998 | Bates ......................... 361/234 |
| 5,793,192 A | * | 8/1998 | Kubly et al. ................ 323/312 |
| 5,810,933 A | | 9/1998 | Mountsier et al. |
| 5,838,529 A | | 11/1998 | Shufflebotham et al. |
| 5,916,689 A | | 6/1999 | Collins et al. |
| 5,946,184 A | * | 8/1999 | Kanno et al. ............... 361/234 |
| 5,958,813 A | | 9/1999 | Aida et al. |
| 6,117,246 A | | 9/2000 | Parkhe et al. |
| 6,149,774 A | * | 11/2000 | Sun et al. .................... 204/164 |
| 6,187,149 B1 | * | 2/2001 | Sun et al. .................... 204/164 |
| 6,215,643 B1 | | 4/2001 | Nagasaki |
| 6,236,555 B1 | | 5/2001 | Leeser |
| 6,373,681 B2 | * | 4/2002 | Kanno et al. ............... 361/234 |
| 6,378,600 B1 | | 4/2002 | Moslehi |
| 6,388,861 B1 | * | 5/2002 | Frutiger ...................... 361/234 |
| 6,475,351 B2 | * | 11/2002 | Sun et al. .................... 204/164 |

FOREIGN PATENT DOCUMENTS

JP          10284583 A   * 10/1998   ........... H01L/21/68

* cited by examiner

*Primary Examiner*—Stephen W. Jackson
*Assistant Examiner*—Boris Benenson
(74) *Attorney, Agent, or Firm*—Eschweiler & Associates, LLC (57) ABSTRACT

The present invention is directed to a method for clamping a wafer to an electrostatic chuck using a single-phase square wave AC clamping voltage. The method comprises determining a single-phase square wave clamping voltage for the electrostatic chuck, wherein the determination is based, at least in part, on an inertial response time of the wafer. The wafer is placed on the electrostatic chuck, wherein a gap between the electrostatic chuck and the wafer is defined. The determined single-phase square wave clamping voltage is then applied, wherein the wafer is generally clamped to the electrostatic chuck within a predetermined distance, while an amount of electrostatic charge is generally not allowed to accumulate, thereby enabling a fast de-clamping of the wafer.

20 Claims, 5 Drawing Sheets

CLAMPING AND DE-CLAMPING SEMICONDUCTOR WAFERS ON AN ELECTROSTATIC CHUCK USING WAFER INERTIAL CONFINEMENT BY APPLYING A SINGLE-PHASE SQUARE WAVE AC CLAMPING VOLTAGE

RELATED APPLICATIONS

This application is related to U.S. application Ser. No. 10/642,939, filed on Aug. 18, 2003, entitled, "MEMS Based Multi-Polar Electrostatic Chuck" which is incorporated herein by reference, and U.S. application Ser. No. 10/661,180, filed on Sep. 12, 2003, entitled, "Clamping and De-clamping Semiconductor Wafers on a J-R Electrostatic Chuck Having a Micromachined Surface by Using Force Delay in Applying a Single-Phase Square Wave AC Clamping Voltage".

FIELD OF THE INVENTION

The present invention relates generally to semiconductor processing systems, and more specifically to a method for clamping a wafer to an electrostatic chuck by applying a single-phase square-wave AC clamping voltage.

BACKGROUND OF THE INVENTION

Electrostatic chucks (ESCs) have been utilized in plasma-based or vacuum-based semiconductor processes such as etching, CVD, and ion implantation, etc. for a long time. Capabilities of the ESCs, including non-edge exclusion and wafer temperature control, have proven to be quite valuable in processing semiconductor substrates or wafers, such as silicon wafers. A typical ESC, for example, comprises a dielectric layer positioned over a conductive electrode, wherein the semiconductor wafer is placed on a surface of the ESC (e.g., the wafer is place on a surface of the dielectric layer). During semiconductor processing (e.g., plasma processing), a clamping voltage is typically applied between the wafer and the electrode, wherein the wafer is clamped against the chuck surface by electrostatic forces. Furthermore, the wafer can be cooled by introducing a gas, such as helium, and applying backpressure between the wafer and dielectric layer. A temperature of the wafer can then be controlled by adjusting the backpressure between the wafer and the dielectric layer.

Declamping or un-sticking the wafer from the chuck surface, however, is a concern in many ESC applications. For example, after the clamping voltage is turned off, the wafer typically "sticks" to the chuck surface for a considerable amount of time, wherein the wafer cannot be removed by typical wafer lifting mechanisms (e.g., pins extending through the ESC which are operable to lift the wafer from the surface of the dielectric layer). This wafer declamping problem can reduce the throughput of the process. It is believed that the wafer-declamping problem occurs when residual charges induced by the clamping voltage remain on the dielectric layer or on a surface of the wafer, therein leading to an undesirable electric field and clamping force. According to a charge migration model, residual charges are caused by charge migration and accumulation during clamping, wherein the charges accumulate at the dielectric surface and/or wafer backside (e.g., when the wafer surface comprises an insulating layer).

An RC time constant, for example, can be used to characterize the charge/discharge times which correspond to an amount of time typically required to respectively clamp or de-clamp the wafer. This time constant is determined by the product of a volume resistance of the dielectric layer and a gap capacitance between the wafer and dielectric surfaces, i.e., $$RC = R_{die}C_{gap} = \rho(dielectric)\varepsilon_0\varepsilon_r\frac{d(dielectric)}{gap} \quad (1)$$

where $R_{die}$ is the resistance of the dielectric layer, $C_{gap}$ is the capacitance of the gap between the wafer and the chuck surface, $\rho(dielectric)$ is the volume resistivity of the dielectric layer, $\varepsilon_0$ is the free space permittivity, $\varepsilon_r$ is the dielectric constant of the gap, $d(dielectric)$ is the thickness of the dielectric layer, and gap is the distance between the dielectric and wafer surfaces. For example, for a typical flat-plate ESC, if we assume that $\rho(dielectric)=10^{15}$ Ω-cm, $\varepsilon_0=8.85\times10^{-14}$ F/cm, $\varepsilon_r=1$, $d(dielectric)=0.2$ mm, and gap=3 μm, we find RC=5900 seconds. This is a fairly long charging/discharging time, meaning that if clamping is longer than 5900 seconds, the declamping time will also last approximately 5900 seconds.

A variety of techniques have been previously disclosed for reducing wafer de-clamping problems encountered in the use of ESCs. For example, one conventional technique involves applying a reversal voltage before the wafer is removed from the ESC, therein eliminating a residual attractive force. This reversal voltage, however, is typically 1.5 to 2 times higher than the clamping voltage, and the de-clamping time is still typically quite large. Another conventional technique involves providing a low-frequency sinusoidal AC voltage in order to produce sine wave fields of controlled amplitude and phase. Such low-frequency sinusoidal AC voltages, however, typically provide low clamping forces, as well as fairly long residual clamping times.

Other conventional techniques for de-clamping the wafer include determining a value of an opposite polarity DC drive voltage to be applied to the electrodes in order to cancel the holding effects of the residual electrostatic charge, and thus enable a release of the wafer. Typically, however, this technique involves quite complicated timing circuits, and do not appear to be optimized for wafer inertial effects, backpressure from a cooling gas, or an overall RC time constant of the electrostatic chuck.

Therefore, a need exists in the art for a clamping and declamping system and method which are optimized for wafer inertial effects, as well as for physical and electrical properties of an electrostatic chuck.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

Challenges of the prior art are overcome in the present invention by applying a single-phase square-wave AC voltage to an electrostatic chuck (ESC), wherein a polarity of the square-wave voltage, for example, is switched faster than an inertial response time of a semiconductor wafer being clamped. The present invention utilizes a relatively simple and inexpensive apparatus, in comparison with various conventional electrostatic chucks. As opposed to some conventional techniques which attempt to remove a residual charge as quickly as possible, the method and system of the present invention are designed to generally prevent the residual charge from being generated in the first place. The method is referred to as "wafer inertial confinement", and employs a square wave single-phase AC clamping voltage which can be applied to either a uni-polar or a multi-polar electrode ESC. De-clamping time can further be minimized by adjusting a pulse width and a pulse rise-time of the applied voltage.

According to one aspect of the present invention, the method is applicable to flat-plate ESCs as well as MEMS-based ESCs, wherein the semiconductor wafer is clamped and de-clamped via a wafer inertial confinement mechanism. By controlling parameters such as rise-time, pulse width, and pulse repetition frequency (prf) of a single-phase square wave AC signal, the semiconductor wafer can be reliably clamped due, at least in part, to an inertial mass of the wafer during voltage switching. Furthermore, according to another exemplary aspect of the invention, the wafer can be almost instantaneously de-clamped after the clamping voltage is turned off, due at least in part to the pulse width during clamping being short enough to significantly prevent charge migration and accumulation to a dielectric front surface and/or back surface of the wafer.

According to yet another exemplary aspect of the invention, the ESC may comprise electrode patterns of various types, including, for example, a simple uni-polar structure for a plasma-environment system or a simple D-shape bi-polar structure for a vacuum-environment system. Furthermore, the present invention does not require complicated electrode patterns or complex signal timing control electronics.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention is directed towards a system and a method for clamping and de-clamping a wafer utilizing an electrostatic chuck (ESC). Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

The present invention overcomes challenges of the prior art by providing a system and a method for clamping and de-clamping a wafer (e.g., a semiconductor substrate), wherein a predetermined square-wave voltage is applied to the electrostatic chuck, therein selectively clamping the wafer thereto. According to one exemplary aspect of the present invention, the predetermined square-wave voltage is a function of inertial properties of the wafer, electrical properties of the electrostatic chuck and a backside pressure associated a cooling gas between the wafer and the ESC.

Figure 1:
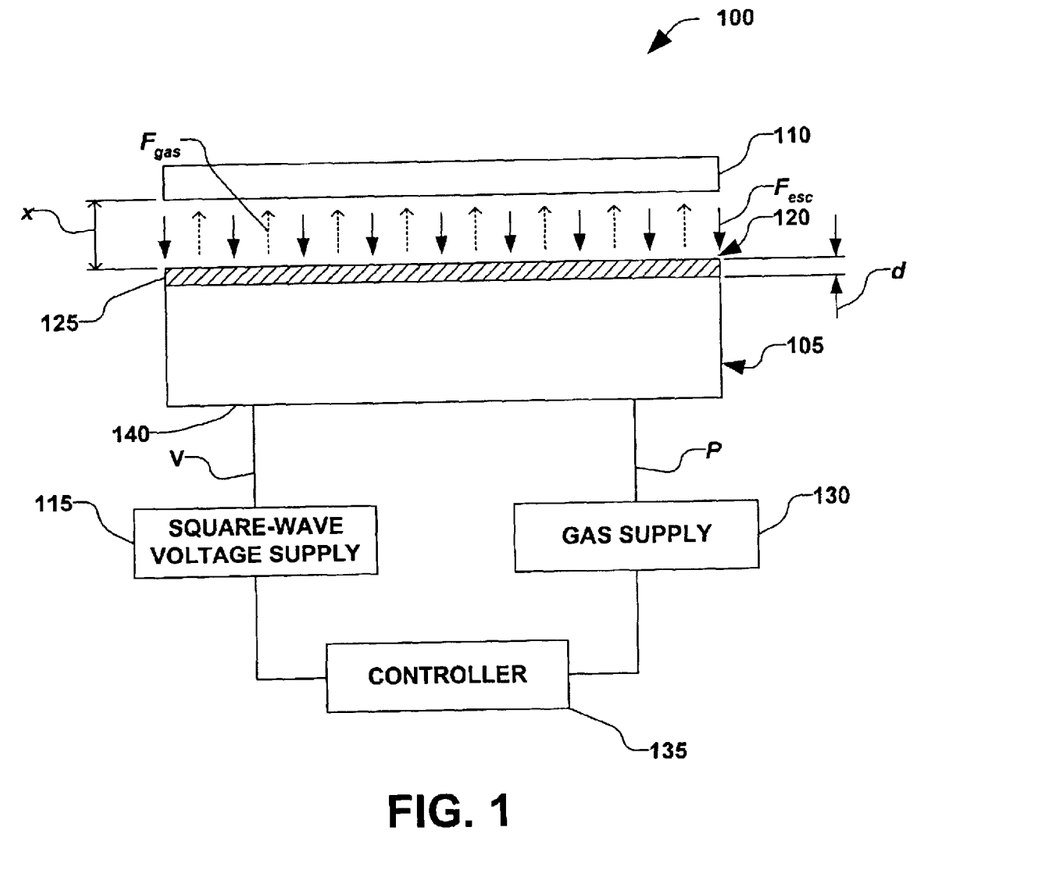
FIG. 1 is a system-level block diagram of an exemplary electrostatic chuck according to one aspect of the present invention.

Referring now to the drawings, FIG. 1 illustrates a block diagram of an exemplary clamping system 100, wherein the clamping system comprises an electrostatic chuck 105 for selectively clamping a wafer 110 thereto. A voltage source 115, for example, is operable to selectively provide a voltage potential V to the ESC 105, wherein the voltage potential is operable to selectively electrostatically clamp and de-clamp the wafer 110 to and from a surface 120 of a dielectric layer 125 of the ESC. According to one exemplary aspect of the invention, the voltage source 115 is operable to provide a single-phase square wave AC clamping voltage V to the ESC 105. Providing a single-phase square wave AC clamping voltage V, for example, can minimize a de-clamping time for the wafer 110, wherein a pulse width and pulse rise-time associated with the square wave are operable to control the de-clamping time, as will be discussed infra. The system 100, for example, further comprises a gas supply 130 operable to provide a backside gas pressure P (also referred to as the cooling gas backpressure force $F_{gas}$) to the wafer 110. The gas supply 130, for example, is operable to provide a cooling gas (not shown), such as helium, between the surface 120 of the ESC 105 and the wafer 110. A controller 135, for example, is further operable to control the pressure P of the cooling gas, wherein the control of the pressure is further operable to control an amount of heat transfer between the ESC 105 and the wafer 110. The controller 135, for example, is further operable to control the application of the clamping voltage V by the voltage source 115 (e.g., a power supply) to the ESC 105.

Providing a square wave clamping voltage V to the ESC 105 in order to efficiently clamp and de-clamp the wafer 110 comprises overcoming several difficulties. For example, a square-wave clamping voltage V applied to the ESC 105 is operable to induce an electrostatic clamping force $F_{esc}$ on the wafer 110, therein attracting the wafer to the surface 120 of the ESC. During a time at which the polarity of the clamping voltage V is reversed (e.g., when the square wave clamping voltage crosses 0 volts), however, the cooling gas backpressure $F_{gas}$ may exceed the clamping force $F_{esc}$, and the wafer 110 may accelerate away from the surface 120 of the ESC 105. The wafer 110 may move a distance x away from the ESC 105 due to a repelling force defined by the cooling gas backpressure $F_{gas}$, and/or other forces, such as gravity (not shown) if the ESC is oriented upside down. The wafer 110 cannot move with an infinite velocity v, however, and the movement of the wafer is limited by its inertial mass. As described by Newton's Second Law, F=ma, the net force F, which is the sum of the clamping force $F_{esc}$ and the backpressure force $F_{gas}$, for instance, is equal to the inertial mass m of the wafer 110, multiplied by an acceleration a of the wafer, wherein the acceleration is defined as a derivative of the velocity and distance i.e., $a=dv/dt=d^2x/dt^2$.

According to one aspect of the present invention, a position of the wafer 110 can be determined as a function of time t, wherein a minimum time dt for which the wafer will not be lost (e.g., the wafer is confined to a region proximate to the ESC 105) can be determined. It should be noted that the clamping force $F_{esc}$ and cooling gas backpressure $F_{gas}$, for example, generally vary as the clamping voltage V crosses 0 volts, since the clamping voltage has a rise-time which is a function of time t, and the backpressure is operable to change with time as a volume of the cooling gas between the wafer 110 and the surface 120 of the ESC 105 expands or compresses.

Mathematically, the dynamics of the inertial confinement of the ESC can be expressed as follows. A movement of the wafer 110 will generally observe Newton's Second Law, F=ma, wherein F is the net force on the wafer. The net force F, for example, can be expressed as the sum of the gas backpressure force $F_{gas}(x,t)$, and the clamping force $F_{esc}(x,t)$, wherein F is a function of distance x and time t, thereby leading to $$F(x, t) = F_{gas}(x, t) - F_{esc}(x, t) = m\frac{d^2x}{dt^2}. \quad (2)$$

Initially, when the wafer 110 is not moving, both the gas backpressure force $F_{gas}$, and the clamping force $F_{esc}$ are generally constant, such that a static gas backpressure force $F_{gas}(0)$ is $$F_{gas}(0) = \frac{P \cdot 1.013 \times 10^5 \cdot \pi \cdot R_W^2}{760}, \quad (3)$$

where P is the gas backpressure (in Torr) applied for desired cooling of the wafer, and $R_W$ is a radius of the wafer. A static clamping force $F_{esc}(0)$ is further expressed as $$F_{esc}(0) = \frac{\pi \cdot R_W^2 \, \varepsilon_0 (k \cdot V_0)^2}{2(d + k \cdot gap)^2}, \quad (4)$$

where $\varepsilon_0$ is the free space permittivity (e.g., $\varepsilon_0=8.85\times 10^{-12}$ F/m), k is the dielectric constant of the insulating dielectric layer 125, d is the thickness of dielectric layer, gap is the static gap length (not shown) between the surface of the ESC 105 and the surface of the wafer 110 (e.g., occupied by the cooling gas), and $V_0$ is the applied clamping voltage. The static gap length gap, for example, can be associated with a surface roughness of the surface 120 of the ESC 105.

When the applied single phase square wave clamping voltage V crosses 0 volts, for example, the wafer 110 may lose the clamping force $F_{esc}$ and begin to move away from the surface 120 of the ESC 105, wherein the gas backpressure force $F_{gas}$ is defined as a function of distance x and time t, $$F_{gas}(x, t) = \frac{F_{gas}(0) \cdot gap}{x + gap}, \quad (5)$$

and the clamping force $F_{esc}$ is also a function of x and t, $$F_{esc}(x, t) = \frac{\pi \cdot R_W^2 \, \varepsilon_0 (k \cdot V(t))^2}{2(d + k \cdot (x + gap))^2}, \quad (6)$$

where V(t) is a clamping voltage across the wafer 105 and an electrode 140 associated with the ESC 105. Alternatively, V(t) is a clamping voltage between two or more electrodes 140 associated with the ESC 105. Furthermore, V(t), for example, is no longer constant and will vary exponentially according to an RC time constant associated with the system 100, where R is the resistance of the wafer 105 and C is the capacitance between the wafer and the electrode 140.

Therefore, the clamping voltage V(t) can be expressed as follows:

$$V(t) = V_0 \left(1 - 2 \cdot \exp\left(\frac{-t}{RC}\right)\right). \quad (7)$$

Combining equations (5) and (6) into equation (2), the dynamics of the inertial confinement of the wafer 110 can be expressed as a differential equation $$D(x, t) = \frac{d^2x}{dt^2} \quad (8)$$

$$= \frac{1}{m} \cdot \left( \frac{F_{gas}(0) \cdot gap}{x + gap} - \frac{\pi \cdot R_W^2 \, \varepsilon_0 \left(k \cdot V_0\left(1 - 2 \cdot \exp\left(\frac{-t}{RC}\right)\right)\right)^2}{2(d + k \cdot (x + gap))^2} \right).$$

The differential equation (8) can be solved numerically for the position x(t) of the wafer 110 by using a computerized differential equation solver, such as Mathcad produced by Mathsoft Engineering and Education, Inc., for a typical 150 mm wafer. After the position x(t) is obtained, the velocity v(t)=dx/dt, and the acceleration $a(t)=d^2x/dt^2$ can further be derived.

Figure 2A:
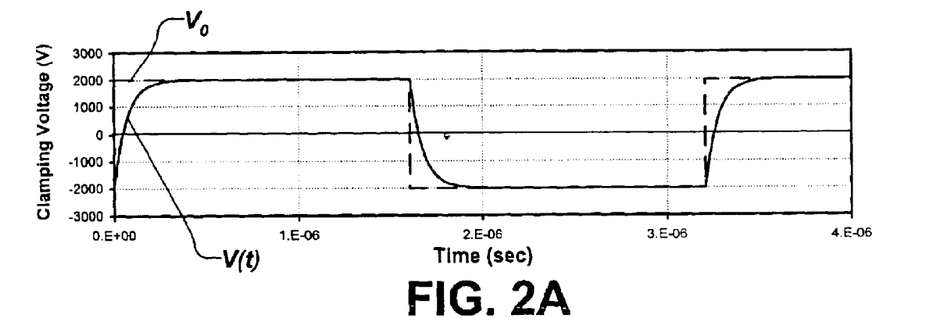
FIGS. 2A–2D are graphs illustrating waveforms of clamping voltage, wafer position, velocity, and acceleration as a function of time for an exemplary classic ESC according to another aspect of the present invention.
Figure 2B:
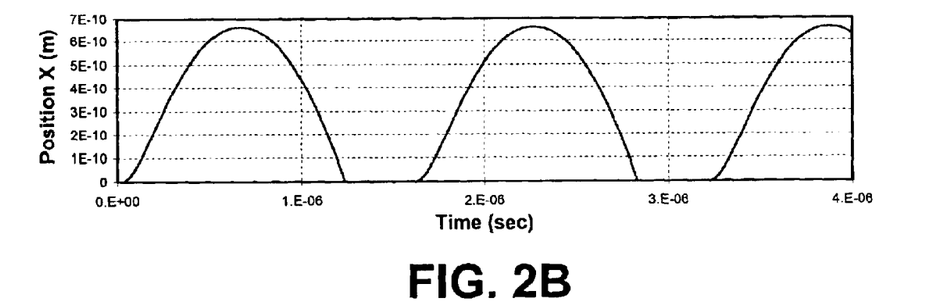
Figure 2C:
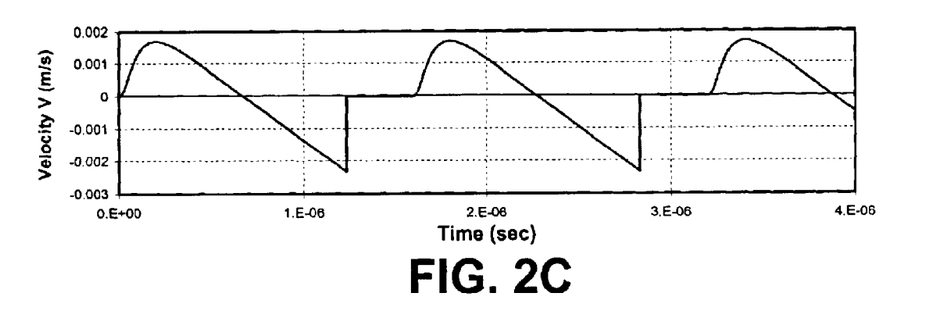
Figure 2D:
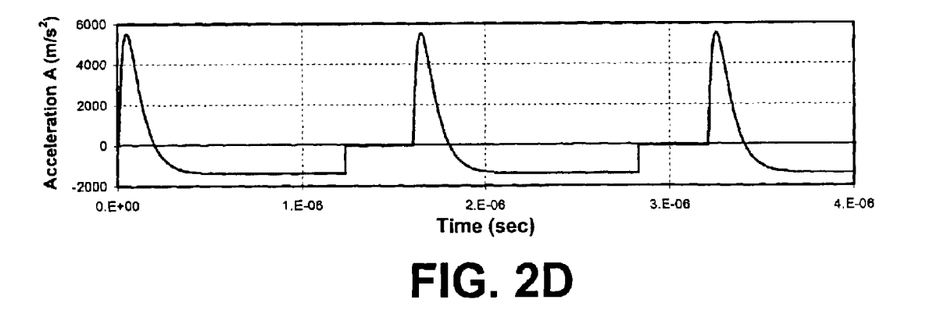

FIGS. 2A–2D illustrate an exemplary single-phase square wave clamping voltage V which is applied to a classic flat-plate ESC 105 of FIG. 1. By controlling parameters such as rise-time, pulse width, and pulse repetition frequency (prf) of the single-phase square wave AC clamping voltage signal, the wafer 110 can be reliably clamped due, at least in part, to the wafer inertial mass during voltage switching. FIG. 2A, for example, illustrates an applied clamping voltage $V_0$ and the voltage V(t) across the wafer 105 and electrode 140 of FIG. 1. The exemplary square wave clamping voltage V of FIG. 2A generally defines the clamping force $F_{esc}$, and FIG. 2B illustrates a result of solving for x(t), wherein a maximum x (e.g., the maximum distance which the wafer moves) and a time required for x to return back to 0 (e.g., an initial position of the wafer) can be determined. The elapsed time between when the wafer leaves and returns to its initial position, for example, is termed the wafer impact time. FIGS. 2C and 2D illustrate the velocity v(t) and acceleration a(t) of the wafer, respectively, and are illustrated for reference.

As an example, the graphs of FIGS. 2A–2D utilize a flat-plate ESC 105 of FIG. 1 having a 150 mm diameter and a 0.2 mm insulative dielectric layer 125 (e.g., an alumina layer) is utilized, wherein a gap of approximately 3 μm between the wafer 110 and the ESC 105 is maintained with a gas backpressure P of approximately 200 Torr. A clamping voltage V of approximately ±2000 volts is applied, wherein a static clamping force of approximately 250 Torr is provided. The capacitance C is approximately 3.4 nF, the resistance R is approximately 20 Ω, therein defining the RC time constant as $RC=6.8\times 10^{-8}$ seconds.

Figure 3:
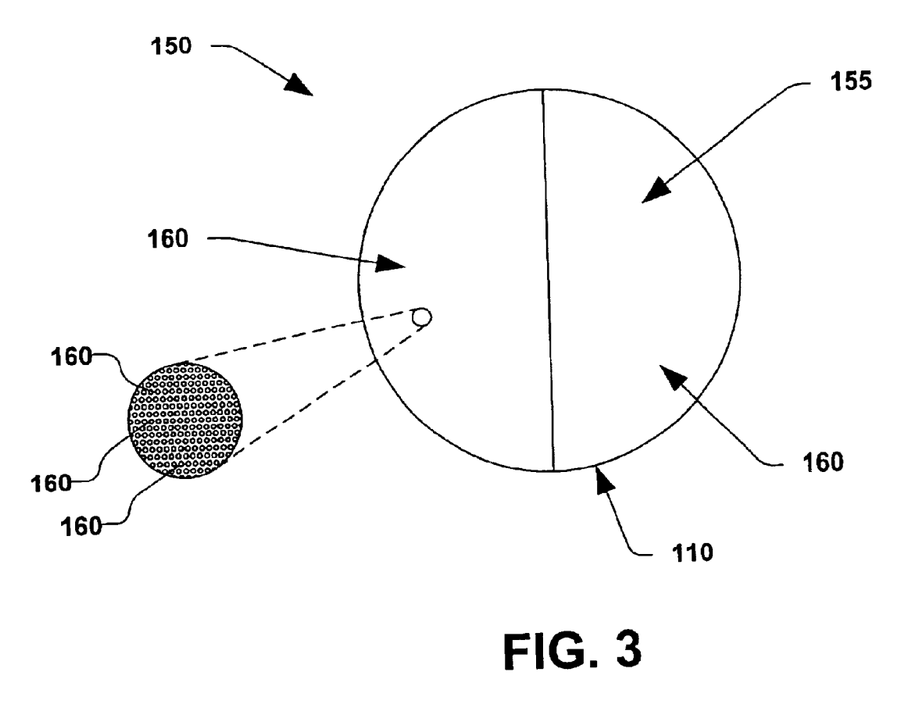
FIG. 3 illustrates an exemplary MEMS-based ESC according to still another exemplary aspect of the present invention.
Figure 4A:
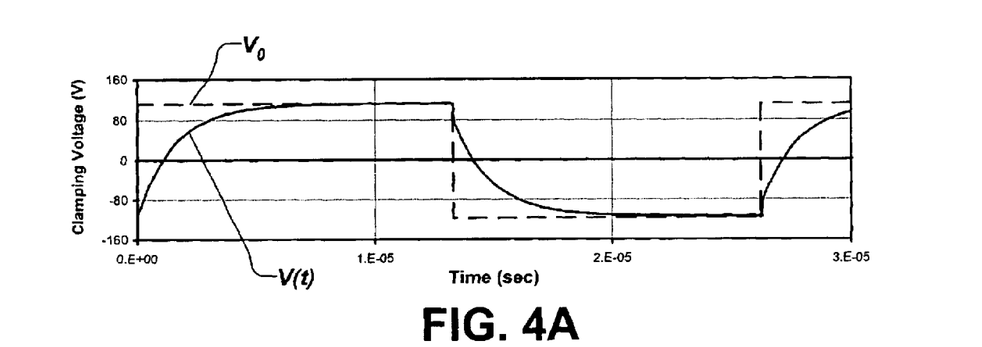
FIGS. 4A–4D are graphs illustrating waveforms of clamping voltage, wafer position, velocity, and acceleration as a function of time for an exemplary MEMS-based ESC according to another aspect of the present invention.
Figure 4B:
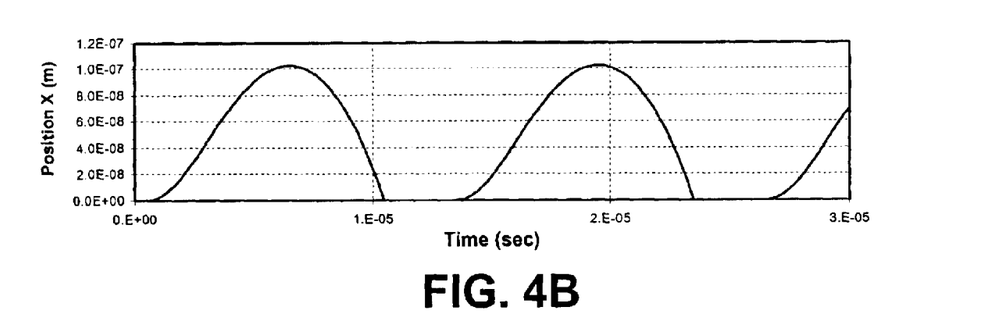
Figure 4C:
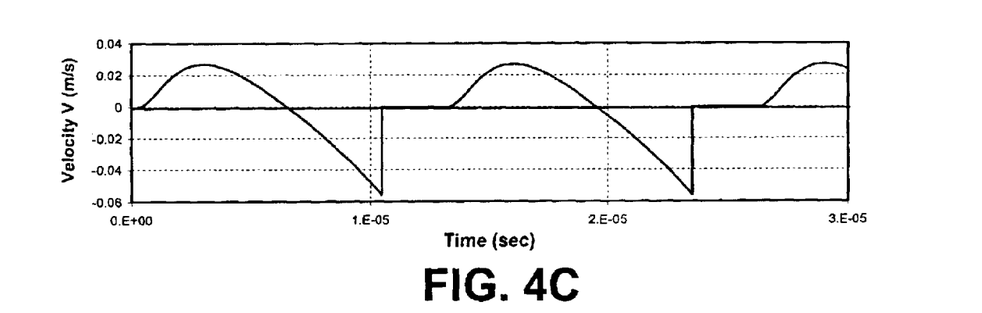
Figure 4D:
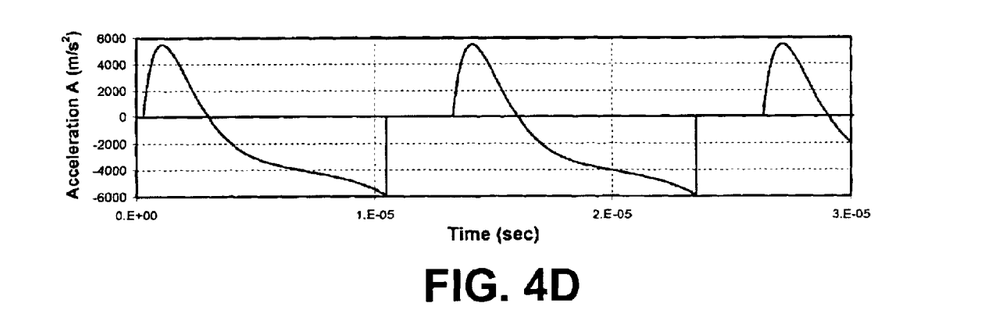

According to another exemplary aspect of the invention, a MEMS-based ESC 105 of FIG. 1 may also be utilized in accordance with the present invention. FIG. 3 illustrates a plan view of an exemplary MEMS-based ESC 150, wherein a surface 155 of the ESC comprises a plurality of microstructures 160. The plurality of microstructures 160, for example, are operable to generally maintain a consistent gap between the wafer (not shown) and the surface 155 of the ESC 150. Again, by controlling parameters such as rise-time, pulse width, and pulse repetition frequency of the single-phase square wave AC voltage signal, the wafer can be reliably clamped due, at least in part, to the wafer inertial mass during voltage switching. Utilizing a MEMS-based ESC 150, however, generally permits the clamping voltage V to be significantly lower than the classic flat-plate ESC 105 of FIG. 1.

The graphs illustrated in FIGS. 4A–4D, for example, depict exemplary waveforms of clamping voltage V, wafer position x, velocity v, and acceleration a, respectively, as a function of time for a MEMS-based ESC 150 of FIG. 3 according to the present invention. For example, a MEMS-based ESC 150 having a 150 mm diameter is utilized, wherein a gap of approximately 1 $\mu$m between the wafer (not shown) and the ESC is maintained with a backpressure P of approximately 200 Torr, and a clamping voltage V of approximately ±112 volts, therein providing approximately 400 Torr static clamping force. The capacitance C, for example, is approximately 78.2 nF, the resistance R is approximately 20 $\Omega$, therein defining the RC time constant of RC=$1.56 \times 10^{-6}$ seconds.

Referring again to FIGS. 2A and 4A, according to another exemplary aspect of the present invention, the pulse width of the clamping voltage V can have a generally large range. A lower limit of the pulse width, for example, is preferably longer than the wafer impact time as described above. Furthermore, in another example, the pulse width is preferably greater than 10 times the wafer impact time in order to provide a higher reliability factor for the ESC. For example, the shortest pulse widths for the classic and MEMS-based ESCs described above are approximately 1.3 $\mu$sec and 11 $\mu$sec, respectively. An upper limit of the pulse width, for example, is determined by a predetermined declamping time associated with a throughput specification for the ESC, since the declamping time is proportional to the clamping time under a particular clamping voltage. If a declamping time shorter than 0.5 seconds is desired, for example, a range of the pulse width for the above classic ESC example should be from approximately 1.3 $\mu$sec to approximately 0.5 seconds, corresponding to pulse repetition frequencies of approximately 300 kHz to 1 Hz. A range of the pulse width according to the above MEMS-based ESC example should be approximately between 11 $\mu$sec to 0.5 seconds, corresponding to a prf of approximately 40 kHz to 1 Hz.

According to another exemplary aspect of the present invention, there exists no tight limit for the RC constant associated with the system 100 of FIG. 1. For example, R is the resistance of a silicon wafer, and can be generally varied in a mild range. For the MEMS-based ESC 150 of FIG. 3, for example, the capacitance C is directly determined by the gap between surface 155 and the wafer (not shown), wherein the clamping force $F_{esc}$ is furthermore directly determined by the gap. For a classic flat-plate ESC, however, both the capacitance C and the clamping force $F_{esc}$ are generally determined by a combination of the gap and the dielectric layer 125 of FIG. 1. According to one example, an RC time constant should be maintained as small as possible, however, the RC time constant is generally limited by the resistance R of the wafer and chuck surface conditions. Generally, the shorter the RC time constant, the smaller the movement x of the wafer, and the shorter the wafer impact time. Similarly, the larger the RC time constant, the larger the movement x of the wafer, and the larger the wafer impact time. If the RC time constant is too large, for example, the wafer 110 may move a distance (e.g., an "escape distance") so far away from the ESC 105 that it cannot be retrieved by electrostatic force, wherein the wafer is subsequently "lost" from the ESC. According to another example, the RC time constant will affect the rise time of the single-phase square wave clamping voltage.

As can be seen through the above examples, the classic flat-plate ESC is generally more forgiving, wherein a wafer movement x of $7 \times 10^{-10}$ m (0.0007 $\mu$m) and a $1.2 \times 10^{-6}$ second wafer impact time is exhibited when the clamping voltage V switches polarity and crosses 0 volts. This distance can be considered negligible when compared to the 3 $\mu$m averaged static gap. The MEMS-based ESC example is relatively less forgiving, with a $1 \times 10^{-7}$ m (0.1 $\mu$m) wafer movement x and a $1.2 \times 10^{-5}$ second wafer impact time due to the capacitance C being approximately one order of magnitude larger. However, an advantage of the MEMS-based ESC over the classic ESC is that the gap between the ESC and the wafer can be well controlled in the MEMS-based ESC, so that a smaller gap and a lower clamping voltage V (or a larger clamping force under the same voltage) is possible. A lower clamping voltage V, for example, lowers a risk of a deleterious electrical discharge, and also lowers a risk of forming particulates which may contaminate the ESC.

According to another example, an upper limit of the RC time constant is such that the wafer movement x is less than one tenth of the initial gap, since the gap, for example, has a large impact on the gas cooling capability. However, since the pulse width can vary by a large range, a longer pulse width (lower pulse repetition frequency) can be selected in order to minimize the impact of the wafer movement. Preferably, the pulse width is less than 0.1 seconds, and the rise-time of the square wave clamping voltage is less than 2 $\mu$sec, for a maximum movement x of approximately 0.5 $\mu$m and 0.11 $\mu$m for the classic ESC and MEMS-based ESC, respectively. While the pulse width is not critical, a 0.1 msec to 0.1 second prf will provide a generally rapid de-clamping time.

In accordance with the another exemplary aspect of the present invention, the ESCs of FIGS. 1 and 3 may further comprise electrode patterns of various types, including, for example, a simple uni-polar structure for a plasma-environment system or a simple D-shape bi-polar structure for a vacuum-environment system. Furthermore, the present invention does not require complicated electrode patterns or complex signal timing control electronics. The wafer can be almost instantaneously de-clamped after the clamping voltage V is turned off, due, at least in part, to the pulse width during clamping being short enough to significantly prevent charge migration and accumulation to the dielectric front surface and/or back surface of the wafer.

While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

Figure 5:
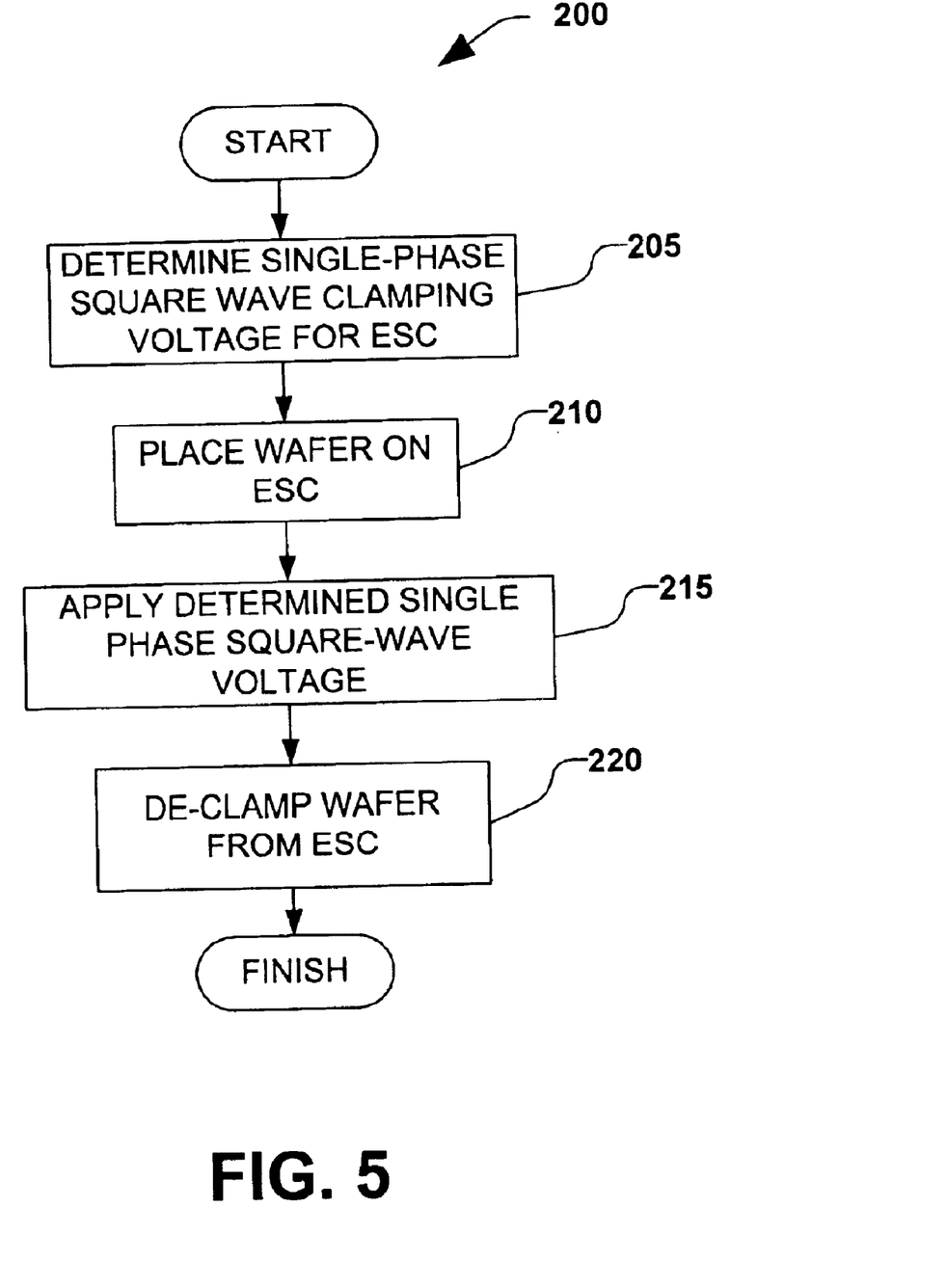
FIG. 5 illustrates an exemplary method for clamping and declamping a wafer according to another exemplary aspect of the present invention.

Referring now to FIG. 5, a method 200 for clamping a semiconductor wafer to an electrostatic chuck is illustrated in accordance with one exemplary aspect of the present invention. Beginning with act 205, a single-phase square wave clamping voltage is determined, based, at least in part, on an inertial response time of the wafer. In act 210, the wafer is placed on a clamping surface of the electrostatic chuck. The clamping surface, for example, may comprise a flat-plate electrostatic chuck surface, or a MEMS-based electrostatic chuck surface comprising a plurality of microstructures extending from the chuck surface. In act 215, the determined single-phase square wave clamping voltage is applied to the ESC, wherein the wafer is generally clamped to the ESC. The determined clamping voltage, for example, is operable to generally induce an electrostatic force between the ESC and the wafer, therein generally attracting the wafer to the surface of the ESC. In act 220, the single-phase square wave clamping voltage is stopped, therein de-clamping the wafer from the ESC. The de-clamping time, for example, is minimized due to the clamping voltage determination performed in act 205.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method for clamping a semiconductor wafer to an electrostatic chuck, comprising:
    determining a single-phase square wave clamping voltage for the electrostatic chuck, wherein the determination is based, at least in part, on a wafer impact time;
    placing the wafer on the electrostatic chuck, wherein a gap is defined between the wafer and the electrostatic chuck;
    applying the determined single-phase square wave clamping voltage to the electrostatic chuck, therein electrostatically clamping the wafer to the electrostatic chuck; and
    stopping the determined single-phase square wave clamping voltage, therein de-clamping the wafer from the electrostatic chuck.

2. The method of claim 1, wherein the determined single-phase square wave clamping voltage is applied to one or more electrodes associated with the electrostatic chuck.

3. The method of claim 1, wherein the electrostatic chuck comprises a flat-plate electrostatic chuck surface comprising a dielectric layer, and wherein placing the wafer on the electrostatic chuck comprises placing the wafer on the dielectric layer.

4. The method of claim 1, wherein the electrostatic chuck comprises a MEMS-based electrostatic chuck surface comprising a plurality of microstructures, and wherein placing the wafer on the electrostatic chuck comprises placing the wafer on the plurality of microstructures.

5. The method of claim 4, wherein the plurality of microstructures provide a substantially uniform surface upon which the wafer is placed, and wherein the gap is significantly uniform across the electrostatic chuck.

6. The method of claim 1, further comprising applying a cooling gas backpressure on the wafer through the electrostatic chuck, wherein the determined single-phase square wave clamping voltage is further determined based on the cooling gas backpressure.

7. The method of claim 1, wherein the determined single-phase square wave clamping voltage is defined by a waveform having a rise time, a pulse width, and a pulse repetition frequency, and wherein the waveform is a function of an RC time constant associated with the electrostatic chuck, the wafer, wafer impact time.

8. The method of claim 1, wherein determining the single-phase square wave clamping voltage further comprises determining a rise time of the determined single-phase square-wave clamping voltage, wherein the rise time is approximately less than the wafer impact time.

9. The method of claim 1, wherein the determined single-phase square wave clamping voltage causes a movement of the wafer away from the electrostatic chuck when the square wave crosses 0 volts, and wherein the movement is less than one tenth of the gap between the wafer and the electrostatic chuck.

10. The method of claim 1, wherein a pulse width of the determined single-phase square wave clamping voltage is shorter than a de-clamping time associated with the electrostatic chuck and the wafer.

11. The method of claim 1, wherein a pulse width of the determined single-phase square wave clamping voltage is longer than the wafer impact time.

12. The method of claim 11, wherein the pulse width of the determined single-phase square wave clamping voltage is approximately 10 or more times longer than the wafer impact time.

13. A system for clamping a wafer, comprising:
    an electrostatic chuck comprising one or more electrodes operable to provide an electrostatic clamping force between a surface thereof and the wafer, the electrostatic chuck further having an RC time constant and a repelling force which is generally opposite the clamping force associated therewith, wherein a predetermined escape distance is generally defined by a wafer impact time, wherein the wafer impact time is further associated with the RC time constant of the electrostatic chuck; and
    a power supply configured to provide a single-phase square wave clamping voltage to the one or more electrodes.

14. The system of claim 13, wherein a rise time of the single-phase square wave clamping voltage is approximately less than the wafer impact time.

15. The system of claim 13, wherein a pulse width of the single-phase square wave clamping voltage is shorter than a de-clamping time associated with the electrostatic chuck and the wafer.

16. The system of claim 13, wherein a pulse width of the single-phase square wave clamping voltage is longer than the wafer impact time.

17. The system of claim 16, wherein the pulse width of the determined single-phase square wave clamping voltage is approximately 10 or more times longer than the wafer impact time.

18. The system of claim 13, wherein the surface comprises a flat plate.

19. The system of claim 13, wherein the surface comprises a plurality of MEMS microstructures.

20. The system of claim 13, further comprising a cooling gas supply, wherein the cooling gas supply is operable to provide a cooling gas backpressure between the surface of the electrostatic chuck and the wafer, therein contributing to the repelling force.

* * * * *